(12) United States Patent
Branch et al.

(10) Patent No.: US 6,650,191 B2
(45) Date of Patent: Nov. 18, 2003

(54) LOW JITTER RING OSCILLATOR ARCHITECTURE

(75) Inventors: Charles M. Branch, Frisco, TX (US); Lieyi Fang, Plano, TX (US); Daramana Gata, Plano, TX (US); James R. Hochschild, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/213,859

(22) Filed: Aug. 7, 2002

(65) Prior Publication Data

US 2003/0076179 A1 Apr. 24, 2003

Related U.S. Application Data

(60) Provisional application No. 60/317,995, filed on Sep. 7, 2001.

(51) Int. Cl.[7] .................................................. H03B 1/00
(52) U.S. Cl. ........................................................ 331/57
(58) Field of Search ............................... 331/57, 107 R, 331/108 R, 108 B, 108 C, 108 D, 107 S, DIG. 2, DIG. 3; 327/156, 158, 159

(56) References Cited

U.S. PATENT DOCUMENTS

| | | | | |
|---|---|---|---|---|
| 4,656,369 A | * | 4/1987 | Lou | ............................ 327/536 |
| 5,600,284 A | | 2/1997 | Nguyen et al. | |
| 5,635,879 A | * | 6/1997 | Sutardja et al. | ................ 331/57 |
| 5,686,867 A | * | 11/1997 | Sutardja et al. | ................ 331/57 |
| 5,847,617 A | * | 12/1998 | Reddy et al. | .................. 331/57 |
| 5,955,929 A | | 9/1999 | Moon et al. | |
| 6,452,430 B1 | * | 9/2002 | Tung et al. | .................. 327/156 |

* cited by examiner

Primary Examiner—My-Trang Nu Ton
(74) Attorney, Agent, or Firm—April M. Mosby; Wade James Brady, III; Frederick J. Telecky, Jr.

(57) ABSTRACT

A low power and low jitter CMOS ring oscillator having a novel architecture that includes fully symmetrical differential current steering delay cells. This novel ring oscillator includes a first capacitor coupled between the first power supply rail and a bias voltage input. At least one stage couples across the first capacitor. Each stage includes a first transistor, a second capacitor, and a fully symmetrical differential delay cell. In an embodiment, the first transistor may be a PMOS transistor, where the drain of the first PMOS transistor connects to the first power supply rail and the gate of the first PMOS transistor couple to the bias voltage input. The second capacitor couples between the source of the first transistor and ground and acts as a low pass filter. As a result, the second capacitor minimizes the effects of the thermal and flicker noise of the devices which provide the tail current. The fully symmetrical differential delay cell includes a control input, a differential input and a differential output. The control input couples to the source of the first PMOS transistor. When one stage is present, the differential input couples to the differential output. When more than one stage is present, the differential outputs couple to the differential inputs of the concurrent delay cell. In addition, the delay cell in the last stage couples to the differential input of the delay cell in the first stage.

6 Claims, 3 Drawing Sheets

LOW JITTER RING OSCILLATOR ARCHITECTURE

CROSS-REFERENCE TO RELATED APPLICATION

This application claims priority under 35 USC §119(e)(1) of provisional application Serial No. 60/317,995, filed Sep. 7, 2001.

The present invention relates to a application entitled "Differential Delay Circuit," Serial No. TBD, filed on TBD, which is incorporated by reference herein.

FIELD OF THE INVENTION

The present invention relates to ring oscillators, and, more particularly, to a low power ring oscillator having a extra low jitter.

BACKGROUND OF THE INVENTION

The ring oscillator is a common building block in most communication systems, especially in such applications as phase locked loops, clock generators and clock distribution systems. An advantage for ring oscillators is that they can be integrated on a chip without external components which is essential in architectures where space is a premium. Important characteristics of a ring oscillator include frequency of operation, jitter, phase noise, tuning range, supply voltage variation, and frequency stability with respect to temperature.

FIG. 1 illustrates a known differential structure which is the preferred conventional approach to reduce the effects of noise and interference on the chip. It is comprised of several cascaded stages of identical differential delay cells, $D_1$, $D_2$, and $D_3$ coupled to PMOS transistors $M_{P1}$, $M_{P2}$ and $M_{P3}$. FIG. 2 displays a known differential delay cell including PMOS transistors $M_{P4}$ and $M_{P5}$ and NMOS transistors $M_{N1}$, $M_{N2}$, $M_{N3}$ and $M_{N4}$ coupled to form the differential structure.

A common problem of a CMOS ring oscillators, however, is that of a lower phase noise performance when compared to a LC oscillator or a crystal oscillator. Particularly, in low power applications, the amount of jitter in a ring oscillator is determined by the nature of the differential delay cells and the biasing tail currents. In an effort to reduce the overall jitter of a ring oscillator, care must be taken to ensure that each differential delay cell contributes minimal jitter. Furthermore, in extra low power applications on the order of several tens of microamps, the device noise of each tail current transistor is also an significant source of jitter.

A conventional approach for further reducing jitter or phase noise of the differential oscillators is to increase the current supplied to the differential oscillator. However, due to the low power design, the supply current is limited.

There, however, exists a need for a low power ring oscillator having extraordinarily low jitter.

SUMMARY OF THE INVENTION

To address the above-discussed deficiencies of ring oscillators, the present invention teaches a ring oscillator having the capability of minimizing the clock jitter and phase noise by eliminating the noise injection from the tail current to the oscillator and the kickback noise modulating tail current from the oscillator.

A low jitter CMOS ring oscillator circuit with a fully symmetrical differential current steering delay cell is described. This novel ring oscillator includes a first capacitor coupled between the first power supply rail and a bias voltage input for reducing the modulation of the tail current, such that the overall jitter or phase noise of the ring oscillator is minimized. At least one stage couples across this first capacitor. Each stage includes a first transistor, a second capacitor, and a fully symmetrical differential delay cell. In a first embodiment, the first transistor is a PMOS transistor, where the drain of the first PMOS transistor connects to the first power supply rail and the gate of the first PMOS transistor couple to the bias voltage input. The second capacitor couples between the source of the first transistor and ground and acts as a low pass filter. As a result, the second capacitor minimizes the effects of the thermal and flicker noise of the devices which provide the tail current. The fully symmetrical differential delay cell includes a control input, a differential input and a differential output. The control input couples to the source of the first PMOS transistor. When one stage is present, the differential input couples to the differential output. When more than one stage is present, the differential outputs couple to the differential inputs of the concurrent delay cell. In addition, the delay cell in the last stage couples to the differential input of the delay cell in the first stage.

In another embodiment, having similar configuration to the first embodiment, with the exceptions of (1) the first transistor is a NMOS transistor, where the drain of the first NMOS transistor connects to the ground and the gate of the first NMOS transistor couple to the bias voltage supply and (2) the first capacitor couples between the bias voltage supply and ground.

The focus of this new architecture is (1) to match the rising and falling output voltage in the delay cell, (2) to reduce the kickback noise from the oscillator to the tail current to minimize current modulation, and (3) to reduce the noise injection from the tail current to the oscillator. The rising and falling symmetry of the inverting delay cell output reduces the up-conversion of the low frequency noise, for example flicker noise.

The foregoing described ring oscillator's primary application may be in clock generation for low-voltage handheld devices that require very low power and low jitter. An example of such may include hearing aid applications. It can also be used in circuits such as a PLL, DLL and other clock generator circuits that require low jitter and power.

Advantages of this design include but are not limited to a low power ring oscillator that exhibits minimal period jitter. This design consumes only one quarter of the current used in the conventional schemes, since the jitter of the ring oscillator is inversely proportional to the square root of the supply current. This is very important for low (micro) power applications. This design also may be integrated onto a chip, since low jitter can be achieved in this design using a low supply current. Thus, no external components are used, making the use of LC oscillators or crystal oscillators not necessary. This is very important for the applications with limited space such as hearing aid applications.

BRIEF DESCRIPTION OF THE DRAWINGS

For a more complete understanding of the present invention and the advantages thereof, reference is now made to the following description taken in conjunction with the accompanying drawing in which like reference numbers indicate like features and wherein.

DETAILED DESCRIPTION OF PREFERRED EMBODIMENTS

The invention provides a low jitter CMOS ring oscillator circuit with a fully symmetrical differential current steering delay cell. The key design techniques include matching the rising and falling output voltage in the delay cell to reduce the kickback noise from the oscillator to the tail current and the noise injection from the tail current to the oscillator. The rising and falling symmetry of the inverting delay cell output reduces the up-conversion of low frequency noise, like flicker noise.

Figure 1:
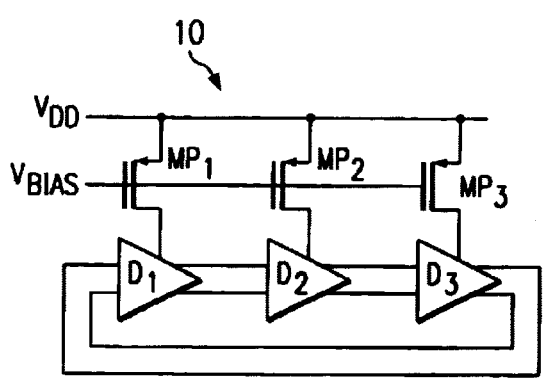
FIG. 1 illustrates a known three-stage CMOS ring oscillator architecture.
Figure 2:
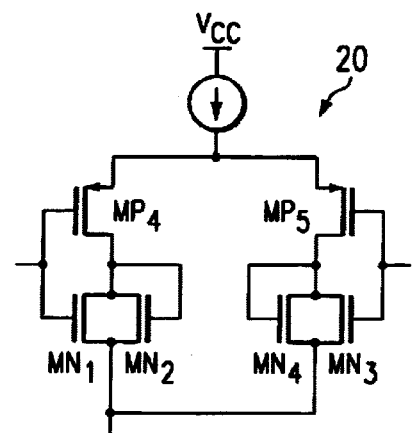
FIG. 2 displays a differential current steering delay cell.
Figure 3A:
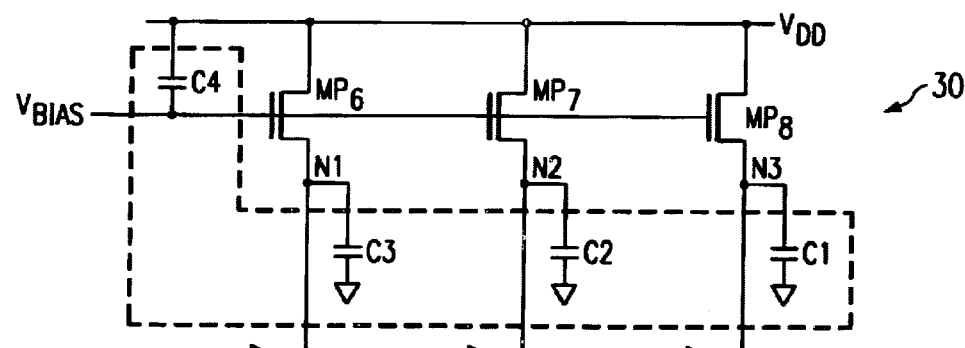
FIG. 3 illustrates a three-stage CMOS ring oscillator architecture in accordance with the present invention.
Figure 3B:
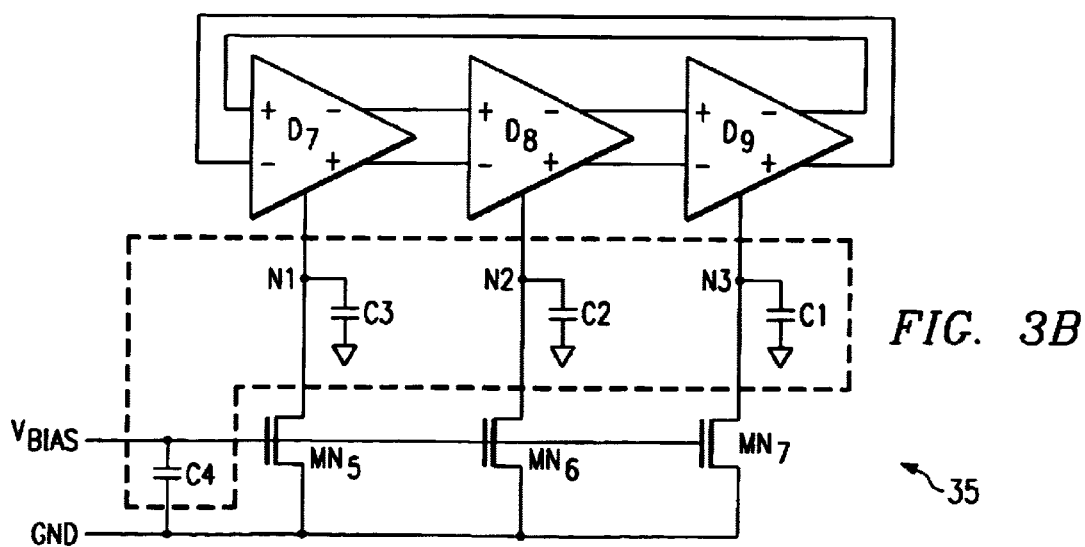

FIGS. 3a and 3b illustrate an extra low jitter ring oscillator architecture in accordance with the present invention. FIG. 3a corresponds to an embodiment using PMOS transistors, $M_{P6}$, $M_{P7}$, and $M_{P8}$. FIG. 3b corresponds to an embodiment using NMOS transistors, $M_{N5}$, $M_{N6}$, and $M_{N7}$. Both are three stage ring oscillators. Capacitors, $C_1$, $C_2$, and $C_3$, are connected to the common mode current bias node, $N_1$, $N_2$, and $N_3$, of each stage, respectively. Capacitor $C_4$ is connected between supply and $V_{Bias}$ or between ground and Vbias. $D_4$, $D_5$, and $D_6$ are the differential delay cells. Transistors, $M_{P6}$, $M_{P7}$, and $M_{P8}$, in FIG. 3a and $M_{N5}$, $M_{N6}$, and $M_{N7}$ in FIG. 3b provide the tail currents to each differential invert stage.

The advantage of using PMOS transistors, $M_{P6}$, $M_{P7}$, and $M_{P8}$, for providing tail current as oppose to that of the NMOS transistors, $M_{N5}$, $M_{N6}$, and $M_{N7}$, is that the PMOS transistors have a lower flicker noise as well as a lower thermal noise for a given tail current. Thus, the noise injected into the inverting stages of the oscillator having PMOS transistors is lower than the ring oscillator having NMOS transistors as shown in FIG. 3b.

In the architecture of FIG. 3a, the noise injected from PMOS transistors, $M_{P6}$, $M_{P7}$, and $M_{P8}$, can be greatly reduced, since capacitors, $C_1$, $C_2$, and $C_3$, provide low impedance paths that act as a low pass filters for each stage respectively. In addition, capacitors, $C_1$, $C_2$, and $C_3$ reduce the voltage variation on common mode nodes, $N_1$, $N_2$, and $N_3$, by reducing the kickback due to charge sharing from the differential inverting stages. Hence, the gate-to-source voltage variation of transistors, $M_{P6}$, $M_{P7}$, and $M_{P8}$, are minimized, and the modulation of the tail currents are reduced. The tail currents are further stabilized by employing a large capacitor $C_4$ which helps to hold the voltage between the gate and source of the tail current transistors, $M_{P6}$, $M_{P7}$, and $M_{P8}$, constant and, hence, reduce the modulation of the tail current. Thus, the power supply rejection ratio (PSRR) is improved, and hence low-jitter performance is achieved.

Figure 5:
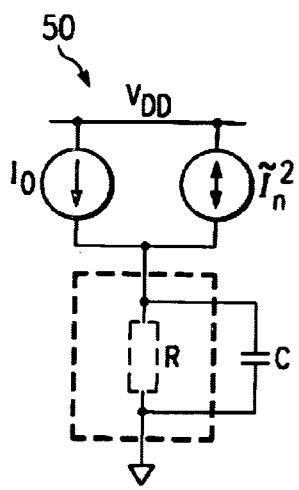
FIG. 5 illustrates the equivalent circuit model for noise injection at each stage of the ring oscillator of FIG. 3.

A simple model explaining the effect of bypass capacitors, $C_1$, $C_2$, and $C_3$, on noise, and hence jitter, reduction is shown in FIG. 5. The resistor, R, inside the dashed line represents the equivalent resistance of the inverting delay sage and $I_o$ is the tail current. Resistor R and the bypass capacitor, C, form a low-pass filter. The noise current source $I_n^2$ includes thermal noise and flicker noise. To reduce the flicker noise, long channel and large PMOS transistors are used. The most dominant noise source is the thermal noise, and it was verified by simulation, since the power spectral density of the thermal noise is uniformly distributed in the entire frequency range.

$$I_n^2 = I_{therm}^2 = \frac{2}{3}(4KTg_m) \quad [1]$$

The overall noise power injected into the inverting delay cell is $$I_{n\,total}^2 = \frac{2}{3}(4KTg_m)B \quad [2]$$

where $g_m$ is the transconductance of the PMOS, and B is the equivalent frequency bandwidth without the bypass capacitor C. With the bypass capacitor, C, only small portion of the noise current will be injected into the inverting delay cell (Equation 3).

Figure 6:
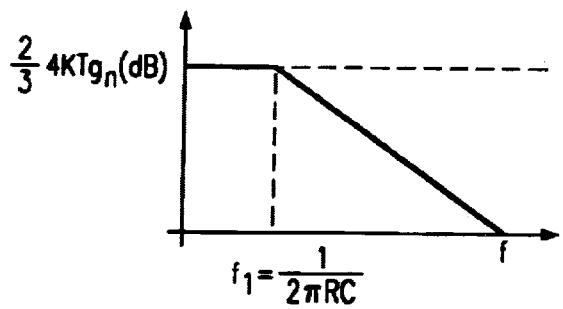
FIG. 6 shows the noise transfer characteristic of the three-stage CMOS ring oscillator shown in FIG. 3.

FIG. 6 illustrates the effect of noise reduction by the low-pass filtering, the high frequency noise power is greatly reduced; thus, the total noise current injected into the inverting delay cell is reduced and it is expressed as follows:

$$I_{n\,total}^2 = \frac{2}{3RC}(KTg_m) \quad [3]$$

In summary, for low power applications, the device noise, such as thermal and flick noise, are the most dominant sources of jitter in a ring oscillator. To reduce timing jitter in such a ring oscillator, the noise injection from the tail current transistors must be minimized. Furthermore, a minimum number of the stages (i.e. three or four) are preferred for low power applications in order to minimize the power consumption for a given oscillation frequency and clock jitter specification.

Figure 4:
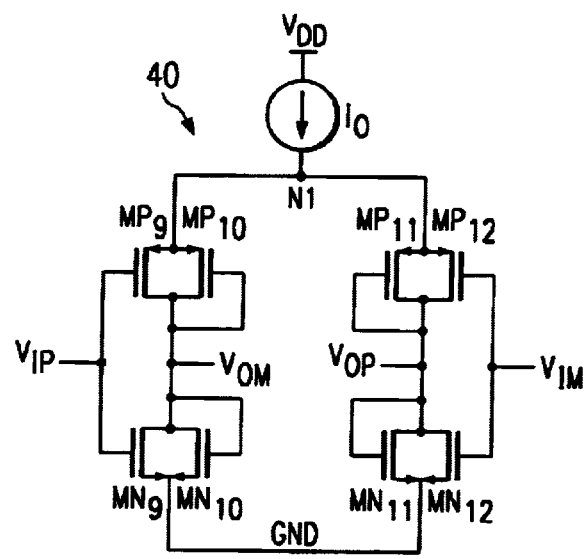
FIG. 4 displays a fully symmetrical differential current steering delay cell in accordance with the present invention.

The fully symmetrical differential current steering delay cell used in the ring oscillators of 3a and 3b is displayed in more detail in FIG. 4. The new structure employs two MOS diodes, $M_{P10}$, $M_{N10}$, $M_{P11}$, and $M_{N11}$, connected to the output nodes for each half circuit. The diodes $M_{P10}$ and $M_{P11}$ are connected to the common node $N_1$ of FIG. 3a. The rising and falling edge on each of the output nodes, $V_{om}$ and $V_{op}$ can be controlled to be symmetrical by sizing the MOS diodes. This symmetry is important to reduce the jitter and phase noise caused by the up-conversion of the low frequency component of the noise, e.g. flick noise of Equations 2 and 3. The output voltage swing is limited so that the oscillation magnitude and the oscillation frequency are insensitive to the supply voltage variation. The diodes connected to the common mode node, $N_1$, also steer the current flowing into each half circuit in the differential delay cell, and thus, reduces the voltage variation on $N_1$. Hence, the kickback from the delay cell to the tail current is reduced. The supply current is constant throughout the period of oscillation, improving the phase-noise characteristics of the oscillator.

Figure 7:
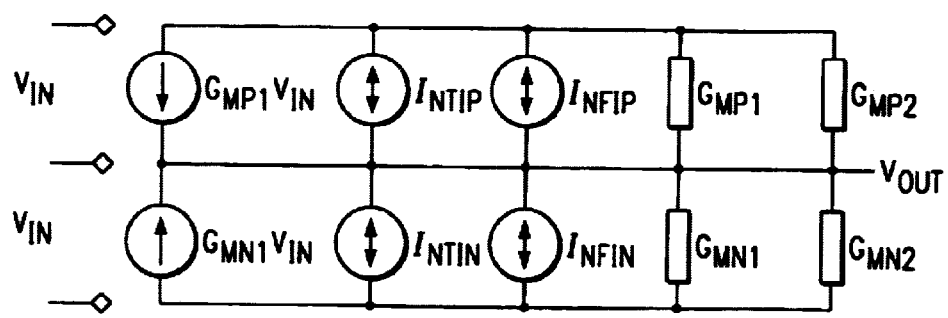
FIG. 7 represents the small signal model for each stage of the three-stage CMOS ring oscillator shown in FIG. 3.

FIG. 7 displays the half circuit small signal model for each stage for analysis. Even though the ring oscillator is a non-linear circuit, the linearized small signal model can still provide some insights regarding the noise reduction. The stage gain is given by:

$$G = \frac{g_{mp1} + g_{mn1}}{g_{dsp1} + g_{dsn1} + g_{mp2} + g_{mn2} + j\omega c_L} \quad [4]$$

where $C_L$ is the total capacitance on the output node. Neglecting the noise contribution from the diodes $MN_{10}$ and $MP_{10}$, then the overall noise output power spectral density of this stage is:

$$V_n^2 = \frac{I_{ntln}^2 + I_{nfln}^2 + I_{ntlp}^2 + I_{nflp}^2}{(g_{dsp1} + g_{dsn1} + g_{mp2} + g_{mn2})^2 + (\omega c_L)^2} \quad [5]$$

where $I_{nt1n}^2$ and $I_{nt1p}^2$ are the thermal noise currents. $I_{nf1n}^2$ and $I_{nf1p}^2$ are the flicker noise currents.

$$I_{ntln}^2 = \frac{2}{3} 4KT g_{mn} \quad [6]$$

and $$I_{ntlp}^2 = \frac{2}{3} 4KT g_{mp} \quad [7]$$

It can be seen in equations 4 through 7 that the larger the transconductance of the input transistor, the larger the stage gain, and so are the slew rate and the noise output power. However, the slew rate is limited by the tail current and thee maximum slew rate is $$SR = \frac{I_0}{C_L} \quad [8]$$

therefore, high stage gain is not always beneficial. The transconductance of the input transistors and the stage gain has to be optimized to achieve the maximum slew rate and the minimum noise power at each stage, and thus the minimum timing jitter in the oscillator.

Figure 8:
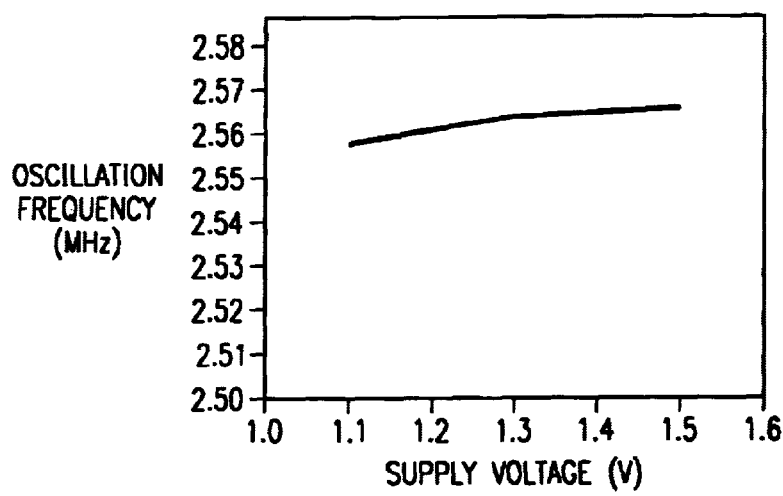
FIG. 8 shows a diagram of the oscillation frequency versus the supply voltage.
Figure 9:
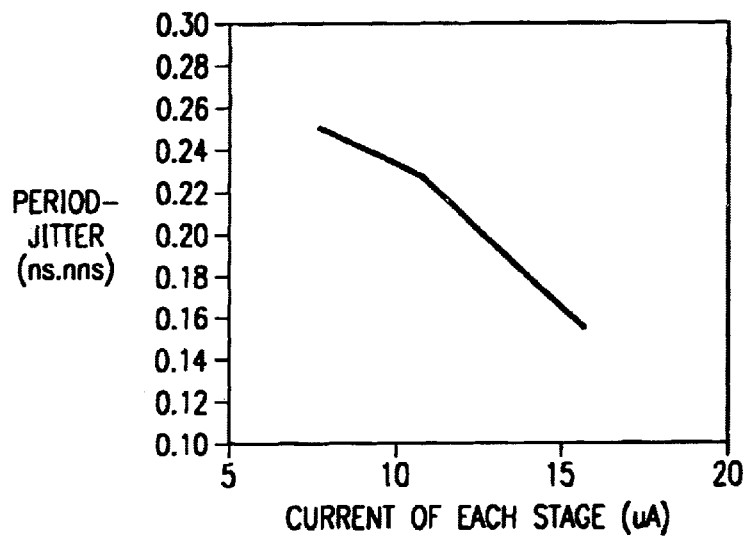
FIG. 9 displays a diagram of the jitter as a function of tail current.

FIG. 8 illustrates that frequency is insensitive to supply voltage variation. For a supply voltage within the range of 1.1V to 1.5V, the oscillation frequency is virtually constant as shown. FIG. 9 illustrates that period jitter is a function of the tail current; thus, jitter decreases with increasing tail current. In the case where bypass capacitors are used and a tail current of 16 μA is consumed by each stage, the rms period-jitter of 156 ps is achieved, which corresponds to 68 dB of phase noise.

Figure 10:
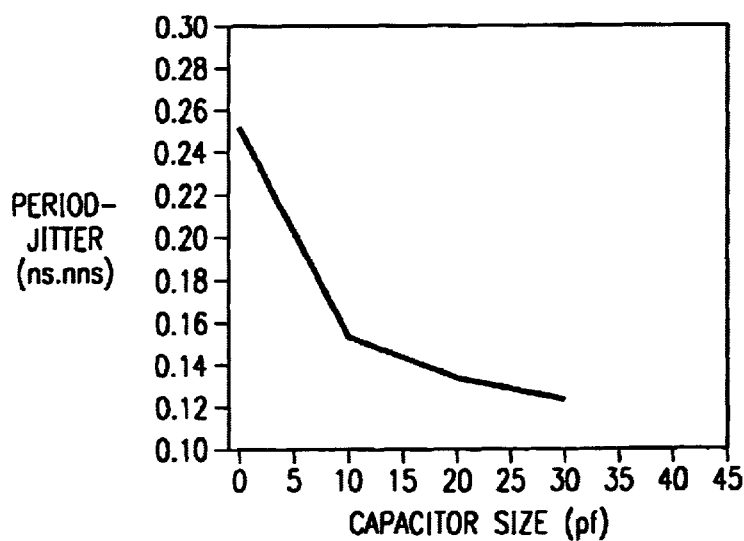
FIG. 10 represents a diagram of the jitter as a function of bypass capacitors.

The results of simulation for the novel three-stage ring oscillator of FIG. 3a where different sizes of capacitors yields that display of jitter as a function of bypass capacitors, $C_1$, $C_2$ and $C_3$, in FIG. 10. For oscillation frequency of 2.56 MHz, the period jitter decreases with increasing size of the capacitors, $C_1$, $C_2$ and $C_3$. The ring oscillator 30 however reaches a saturation point where further increasing the size of the bypass capacitor does not improve conditions. Beyond that point, the jitter is only contributed by the delay cell. For oscillation frequency of 2.56 MHz, the rms period jitter is 246 ps without bypass capacitors and it is only 136 ps with 30 pF bypass capacitors. An improvement of about 6 dB is observed.

The foregoing described ring oscillator's primary application may be in clock generation for low-voltage handheld devices that require very low power and low jitter. An example of such may include hearing aid applications. It can also be used in circuits such as a PLL, DLL and other clock generator circuits that require low jitter and power.

Advantages of this design include but are not limited to a ring oscillator having a high performance, simple, and cost effective design; wherein the ring oscillator requires minimal power and exhibits minimal period jitter.

The reader's attention is directed to all papers and documents which are filed concurrently with this specification and which are open to public inspection with this specification, and the contents of all such papers and documents are incorporated herein by reference.

All the features disclosed in this specification (including any accompany claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

We claim:

1. A ring oscillator, having a first, second, and third power supply rail, comprising:
    a first capacitor coupled between the first power supply rail and the bias voltage input; and
    at least one stage coupled across the first capacitor comprising,
        a first transistor having a gate, a drain, and a source, the drain coupled to the first power supply, the gate coupled to the bias voltage input,
        a second capacitor coupled between the source of the first transistor and the third power supply rail, and
        a fully symmetrical differential delay cell, having a control input, a differential input and a differential output, the source of the first transistor coupled to the control input to apply a supply voltage,
    wherein, when one stage is present, the differential inputs couple to the differential outputs,
    wherein, when more than one stage is present such that a first and a last stage exists, the differential outputs of each delay cell coupled to the differential inputs of the delay cell in the concurrent stage, and the differential outputs of the delay cell in the last stage couples to the differential inputs of the delay cell in the first stage.

2. A ring oscillator as recited in claim 1, wherein the first transistor is a PMOS transistor and the third power supply rail is ground.

3. A ring oscillator as recited in claim 1, wherein the first transistor is a NMOS transistor and the first and third power supply rails are ground.

4. A ring oscillator as recited in claim 1 wherein the fully symmetrical differential delay cell comprises,
    a current source coupled to the first power supply rail;
    a first input circuit including a second and third transistor, each transistor having a respective gate, source and drain, each gate coupled to the first differential input, the source of the second transistor coupled to the current source, the source of the third transistor coupled to the third power supply rail;
    a second input circuit including a fourth and fifth transistor, each transistor having a respective gate, source and drain, each gate coupled to the first differential input, the source of the fourth transistor coupled to the current source, the source of the fifth transistor coupled to the third power supply rail, the drain of the fourth transistor coupled to the drain of the fifth transistor;

a first output circuit having a first common node coupled to the first differential output, the first output circuit including two diodes coupled in series between the current source and the third power supply rail, the respective drains of the second and third transistor couple to the first common node; and a second output circuit having a second common node coupled to the second differential output, the second output circuit including two diodes coupled in series between the current source and the third power supply rail, the respective drains of the fourth and fifth transistor couple to the second common node.

5. A ring oscillator as recited in claim 1 wherein the fully symmetrical differential delay cell comprises, a current source coupled to the first power supply line;

a second transistor, having a gate, a drain, and a source, the drain coupled to the current source;

a third transistor, having a gate, a drain, and a source, the drain coupled to the current source, the source coupled to the source of the second transistor, the gate coupled to the source to form a first differential output;

a fourth transistor, having a gate, a drain, and a source, the gate coupled to the gate of the second transistor to form a first differential input, the source coupled to the first differential output, the drain coupled to the third power supply rail;

a fifth transistor, having a gate, a drain, and a source, the source coupled to the first differential output, the gate coupled to the first differential output, the drain coupled to the third power supply rail;

a sixth transistor, having a gate, a drain, and a source, the drain coupled to the current source, the gate coupled to the source to form a second differential output;

a seventh transistor, having a gate, a drain, and a source, the drain coupled to the current source;

a eighth transistor, having a gate, a drain, and a source, the source coupled to the second differential output, the gate coupled to the source, the drain coupled to the third power supply rail; and a ninth transistor, having a gate, a drain, and a source, the gate coupled to the gate of the seventh transistor to form a second differential input, the source coupled to the second differential output, the drain coupled to the third power supply rail.

6. A phase locked loop, having an input and an output, comprising:

a first frequency divider coupled to the input;

a comparator coupled to the first frequency divider;

a filter coupled to the comparator;

a ring oscillator, having a first, second and third power supply rail, the ring oscillator coupled between the filter and the output, the ring oscillator comprising, a first capacitor, and at least one stage coupled across the first capacitor comprising, a first transistor having a gate, a drain, and a source, the drain coupled to the first power supply, the gate coupled to the bias voltage input, a second capacitor coupled between the source of the first transistor and the third power supply rail, and a fully symmetrical differential delay cell coupled to the source of the first transistor; and a second frequency divider coupled between the ring oscillator and the comparator to provide feedback.

* * * * *